(12) United States Patent
Teutsch et al.

(10) Patent No.: US 7,481,352 B2
(45) Date of Patent: Jan. 27, 2009

(54) METHOD FOR ABLATING POINTS OF CONTACT (DEBUMPING)

(75) Inventors: Thorsten Teutsch, Berlin (DE); Elke Zakel, Falkensee (DE)

(73) Assignee: Pac Tech-Packaging Technologies GmbH, Nauen (DE)

( * ) Notice: Subject to any disclaimer, the term of this patent is extended or adjusted under 35 U.S.C. 154(b) by 0 days.

(21) Appl. No.: 10/398,336

(22) PCT Filed: Oct. 5, 2001

(86) PCT No.: PCT/DE01/03833

§ 371 (c)(1),
(2), (4) Date: Dec. 15, 2003

(87) PCT Pub. No.: WO02/28585

PCT Pub. Date: Apr. 11, 2002

(65) Prior Publication Data

US 2004/0217150 A1    Nov. 4, 2004

(30) Foreign Application Priority Data

Oct. 6, 2000    (DE) ............................... 100 49 664

(51) Int. Cl.
*B23K 1/018*    (2006.01)
(52) U.S. Cl. ........................................ 228/191; 228/264
(58) Field of Classification Search ................ 228/4.5, 228/264, 56.3, 111.5, 208, 259, 260, 261, 228/262.9, 6.2, 191, 180.1
See application file for complete search history.

(56) References Cited

U.S. PATENT DOCUMENTS 3,210,182 A * 10/1965 Funari ........................... 134/5

(Continued)

FOREIGN PATENT DOCUMENTS

DE    44 32 774 A1    9/1994

(Continued)

OTHER PUBLICATIONS

Pac Tech Packaging Technologies, Semiautomatic Solder Ball Bumper (SB$^2$-SM), Pac Tech GmbH, (www.pactech.de), Admitted art published before 2001.

*Primary Examiner*—Kevin P Kerns
*Assistant Examiner*—Michael Aboagye
(74) *Attorney, Agent, or Firm*—Duane Morris LLP

(57) ABSTRACT

The invention relates to a method for removing a plurality of raised places of contact made of a meltable metal, such as tin or indium or an alloy, such as tin-containing solder, silver-containing solder or lead-containing solder, the meltable metal being meltable above a first temperature limit, the places of contact being surface-distributed over a substrate. It is also possible to form vaulted domes on a plurality of metallic support segments which are located on one of the surfaces of a substrate. The invention aims at reducing production costs, particularly at removing a soldered layer once applied. If defective contact places occur, a plurality of the raised contact places, particularly substantially all contacts, are at least in substantial portions melted off from the substrate by contacting them with a molten metal. Between the substrate and the support segments distributed over the substrate and a surface of the molten metal an organic fluid may be present, the organic fluid being provided as a covering layer only and evaporating off the substrate surface, after the vaulted domes have been formed.

26 Claims, 3 Drawing Sheets

U.S. PATENT DOCUMENTS

| | | | |
|---|---|---|---|
| 3,557,430 A * | 1/1971 | Jones | 228/19 |
| 3,684,151 A | 8/1972 | Burman et al. | |
| 4,216,035 A | 8/1980 | Bakos et al. | |
| 4,360,144 A * | 11/1982 | Cuddy et al. | 228/180.1 |
| 4,615,479 A * | 10/1986 | Ohotoshi et al. | 228/180.1 |
| 4,942,997 A * | 7/1990 | Sinkunas et al. | 228/56.1 |
| 5,071,787 A * | 12/1991 | Mori et al. | 29/840 |
| 5,150,832 A * | 9/1992 | Degani et al. | 228/224 |
| 5,411,602 A * | 5/1995 | Hayes | 148/23 |
| 5,620,132 A * | 4/1997 | Downing et al. | 228/264 |
| 5,740,954 A * | 4/1998 | Pai et al. | 228/40 |
| 5,785,234 A * | 7/1998 | Weiss et al. | 228/223 |
| 6,070,788 A * | 6/2000 | Zakel | 228/214 |
| 6,181,015 B1 * | 1/2001 | Gotoh et al. | 257/778 |

FOREIGN PATENT DOCUMENTS

| | | | |
|---|---|---|---|
| DE | 4432774 | * | 9/1994 |
| DE | 195 11 898 A1 | | 3/1995 |
| DE | 4432774 A1 | * | 3/1996 |
| DE | 196 25 139 | | 6/1996 |
| GB | 0315343 A1 | * | 10/1988 |
| WO | WO 88/07317 | | 9/1988 |

* cited by examiner

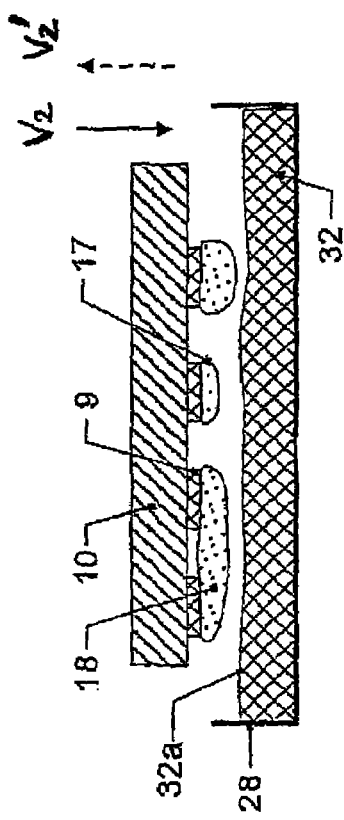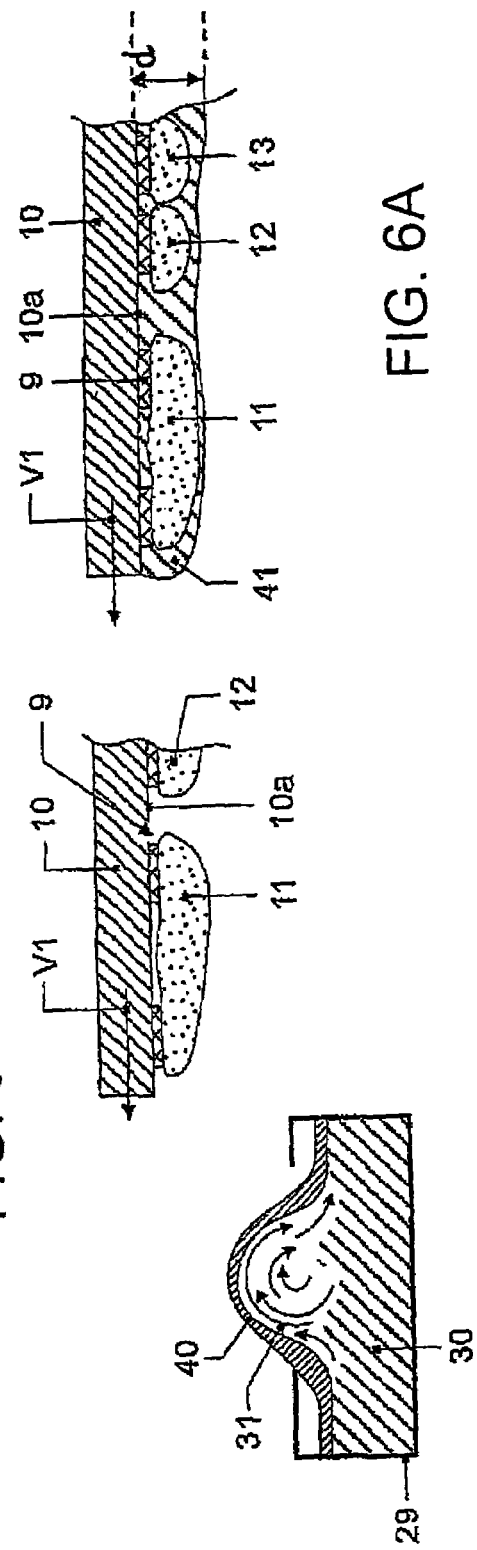

METHOD FOR ABLATING POINTS OF CONTACT (DEBUMPING)

BACKGROUND OF THE INVENTION

The invention relates to a method for removing a plurality of raised places (spots, points) of contact of a meltable metal, such as tin or indium or an alloy, such as tin-containing solder, silver-containing solder or lead-containing solder, said meltable metal being meltable above a first temperature limit, said places of contact being surface-distributed over a substrate. The invention also relates to a method for forming vaulted domes on a plurality of metallic support segments which are distributed over one of the surfaces of a substrate.

In order to explain the problem solved by the methods of the invention, it is noted that not only flat conductive domes provide raised places of contact—also designated as "menisci" which are applied onto metallic support segments—, but that also stronger raised metallic structures can be applied on metallic support segments, said structures being used as solder balls or contact bumps for a flip-chip contact, compare the publication "Semiautomatic Solder Ball Bumper ($SB^2$) by Pac Tech and the publication "Solder Ball Bumper ($SB^2$)—A flexible manufacturing tool for 3-dimensional sensor and microsystem packages", Kasulke, Schmidt, Titerle, Bohnaker, Oppert, Zakel, published in IEMT Europe 1998, FIG. 6 and FIG. 8 in cross-section. Said raised places of contact are manufactured by several different methods, e.g. by laser or by (re-) shaping in an oven, after a preceding placement of a print of smaller solder particles which are melted in said oven, to provide the described raised places of contact in the form of balls. Usually, their height is substantially larger than that of the metallic support segments which are distributed over the substrate. A not completely avoidable probability that metallic bridges are formed by solder balls growing over to other solder balls, caused by too thick layers of flow medium, or that individual solder balls are generally missing, makes the use of the substrate technically impossible, because certain contact places are either not contacted or have a shortcut already prior to being contacted.

A further defective contact can occur due to the fact that a too large quantity of the solder forming said contact bump was applied on the substrate, thus causing an asymmetry of the formed raised contact places, said contact places possibly showing asymmetries in height as well as in a lateral extension, similar to the defects at certain, usually individual metallic support segments, as described before.

Substrates, particularly for forming wafers, are usually too precious to deny the use of the complete substrate if individual portions are damaged by applying the raised contact places upon preparing the contact. Therefore, an inexpensive solution has to be found to repair these contacted substrates which have been damaged during contact. In this respect, a specific solution has already been proposed according to the prior art, namely individually repairing individual contact places as SBB Repair Station (compare the above mentioned publication "Solder Ball Bumper ($SB^2$)", FIG. 10 with the associated description). One single laser impulse is used for obtaining a reflow of the defective contact point and for removing the melted and softened solder bump by using a vacuum. Simultaneously, a nitrogen atmosphere is used to avoid an oxidation of the remaining solder cap on a laterally limited support segment. A basic technical problem solved by the invention is to reduce production cost, particularly to allow a removal of a solder once applied on a substrate, when defects occur, large raised places of contact not being (selectively) located at the positions of the metallic support segments, but, by forming bridges, providing a contact structure which no longer allows a regular use of the substrate, for example as a contacted wafer.

According to the invention, several contact places can be repaired together, such that at least a substantial part of the individual contact places is removed by melting off, said melting taking place in a molten metal, and no individual places of contact have to be removed individually and successively by local heating.

According to the invention, the substrate and all contact places are contacted with a molten metal to remove the complete pre-contacting in an inexpensive and timesaving way, to start from a new status quo and to again coat the substrate with raised places of contact. Said repairing method is a removal of a preceding contact in combination with an option to start the new contact at a state, at which all metallic support segments, which continue to be present, have the same design. This concern, both the contact places not having been contacted by a raised solder ball, and the contact places undergoing a shortcut with at least one further contact place due to an inexactly positioned solder ball.

By melting off, the solder of the raised contact point is taken up by the molten metal. Domes of small height which remain on said support segments receive substantially the metal or the metal alloy of which said molten metal consists. At the same time, said option allows also for repair of defectively contacted substrates by exchanging the first solder which has already solidified, and replacing said solder by the solder corresponding to the molten metal, particularly the molten metallic alloy, which is present in the bath.

When the two metals, particularly the two metal alloys are identical, i.e. the metal of the raised places of contact and the metal of the melted bath, the substances are only removed and not exchanged. At least substantial parts of the already solidified raised places of contact on the substrate are, however, removed, the described domes remaining as "menisci" of small height.

The method is suitable for both de-bumping, i.e. removing of already existing bumps, which bumps are the raised contact places, but it is also suitable for a first time coating of support segments which have not yet been coated. Coating can be performed by applying the molten metal which is present in the bath, but coating can also be performed by removing and newly applying the mentioned molten metal.

Additionally, no more than a covering layer of an organic fluid can for example be applied on the substrate, said covering layer as a film having a small thickness with respect to the substrate. Due to the small thickness of said fluid layer (a thin layer), said layer evaporates after having contacted the molten metal due to the vapor pressure, so that a subsequent cleaning step of the support segments coated for the first time or of the support segments coated again after removal of the pre-contacting and of the associated substrate is not required. Production or repair therefore becomes less expensive. A substantially smaller volume of the fluid applied particularly as a polyalcohol, like glycerol, is used which fluid has evaporated after the described process. In general, the invention avoids the use of a bath of considerable volume with respect to the described fluid.

A first temperature limit is to be understood such that a meltable metal is to be removed, but the substrate is not to be melted. Raised contact places, which are usually made of solder, are meltable at temperatures of below 200° C. (usually below 250° C.). When using glycerol, the organic fluid used has a boiling temperature of 290° C. Similar or comparable substances should have a boiling temperature of above 250° C. When the molten bath is made of an identical metal (particularly as a metal alloy), said first temperature limit also refers to said metal which should accordingly be at least at or above said temperature limit to allow the raised contact places to be melted off and taken up from the substrate.

The distributed arrangement of the described raised contact spots or of the metallic support segments carrying said spots concerns a distribution of the basic contact over a large surface, which are in turn each provided on a metallic basic pad which allows a contact with the interconnecting paths of the substrate when provided as wafers. Said large-surface distribution is a starting point or basis of the invention for proposing a large-area removal by melting off from the substrate.

In accordance with the invention, the raised contact places can be removed substantially completely or completely, and at the same time, their material property can be exchanged.

Suitable substrates can be the substrates also described in the prior art, for example wafers, printed cards, printed boards or ceramic substrates.

As far as a metal is mentioned in the following discussion, a metal alloy is always included. This is valid for both the raised places of contact and the molten metal in the bath. As a bath both a stationary melt, which is contacted by a relative movement with the contact bumps to be removed, and a melt which is at least partly in motion and towards which the substrate with the raised contact places to be removed is moved, can be used. A lowering in a vertical direction corresponds to a practically simultaneous lateral or surface removal of all contact bumps. A relative movement in a horizontal direction in which the substrate approaches a wave-shaped or surge-shaped vertically protruding metal bath corresponds to a band-shaped removal of the raised contact places which is performed successively, but uniformly with regard to the complete surface.

The residence time for an at least contacting immersion or for an approaching movement is determined, to have sufficient time available for melting off the raised contact places and for maintaining or actually providing the remaining dome coating on the support segments.

The thin layer of the medium selected in accordance with the invention evaporates from the substrate surface substantially without residue during contacting with the molten metal. Said film can be applied by spraying or by a vapor atmosphere in the sense of sputtering. When the support segments are provided with raised contact places of a meltable metal already prior to being contacted with the molten metal, said film comes to rest as a thin fluid layer between the substrate and the support segments distributed over said substrate. When raised contact places of a meltable metal have not yet been provided on the support segments, said fluid film also covers the support segments themselves.

A vapor coating can be applied on the substrate simultaneously with the contacting of the metal bath; however, the atmosphere can extend only so far in front of the metal melt that the thin, film-like application of the organic fluid is obtained by a passage or a movement of the substrate with the support segments through said atmosphere.

Said organic fluid can satisfy the same conditions and can be made of the same materials as described in EP 781 186 B1.

The fluid covers the substrate as a covering layer in the form of a film, the film surface which faces away from said substrate directing towards the atmosphere and contacting it. Before being contacted with the molten metal, said support segments can either be covered by said organic fluid film or by said raised contact bumps to be removed; in both cases, the covering layer is formed between the substrate as well as the support segments distributed over said substrate and the surface of the bath. Said formation can also be achieved by spraying before contacting the metal melt.

The use of the fluid layer provided as a covering layer only, which due to its film shape cares for a minimum volume of the fluid to be used, can not only be applied on the substrate by spraying or sputtering, it can also be present as a thin layer on the surface of the metallic bath, or it can be formed during the metallic contact, when the evaporated organic fluid is present in the atmosphere above said bath. All embodiments used achieve a minimum volume quantity of the auxiliary processing fluid and dispensability of an additional cleaning step. Further effects of said fluid in connection with the solder to be applied or removed and with the support segments on the substrate showing a high wettability are described in detail in the prior art (uniformity of the surface structure, reducing effect on the surface, and increase of the wettability of the solder). Moreover, when removing (melting off) said raised solder spots, there is an additional advantageous aspect, namely of supporting the pinch of a reduced surface tension when melting the metal to be removed from the substrate into a molten metal which has a substantially larger volume, so that a substantially uniform formation of menisci on all limited support segments is achieved.

An example may explain the relative proportions: When a wafer has for example a thickness of 600 μm, and the support segments on the substrate have a height of between 5 μm and 10 μm, the covering layer of auxiliary fluid, which is provided as a film, has a film thickness of 50 μm to 200 μm, particularly in a range of 100 μm, said thickness also depending on the height of the raised contact places which, in a range of between 10 μm and 100 μm, can occur as ball-shaped contact bumps. This explains the definition of de-bumping according to which said contact bumps are removed from a surface of a substrate.

BRIEF DESCRIPTION OF THE DRAWINGS

FIG. 4 is a first illustration of a melting-off process wherein a substrate 10 with defectively formed contact places 17, 18 is lowered down into a liquid bath of a molten metal 32.

FIG. 5 is an illustration of a second metallic bath, wherein a surge 31 is adapted to have band shape.

FIG. 6 is an upside-down illustration of a substrate 10, wherein defectively formed contact bumps 11,12 are approached to the flow bath of FIG. 5 along a horizontal movement v1, FIGS. 5 and 6 being spatially coordinated with respect to each other.

DETAILED DESCRIPTION OF THE INVENTION

Figure 1:
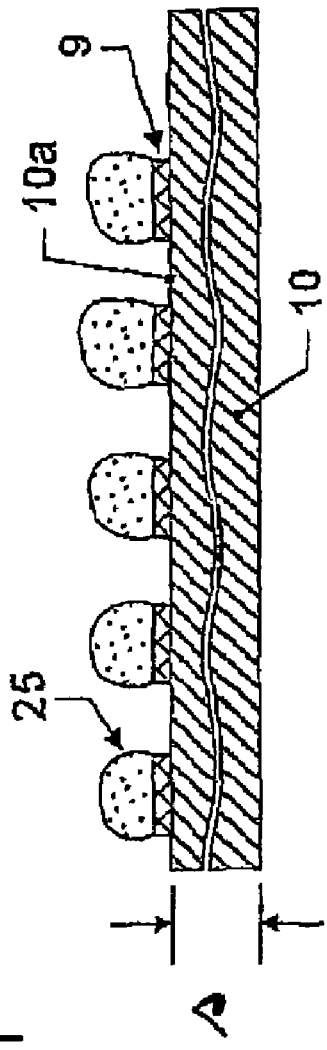
FIG. 1 is a sectional view of a substrate with regularly and correctly applied raised places of contact, said substrate comprising a first metallization 9 and a substantially ball-shaped, raised contact structure 25 provided on said metallization.
Figure 2:
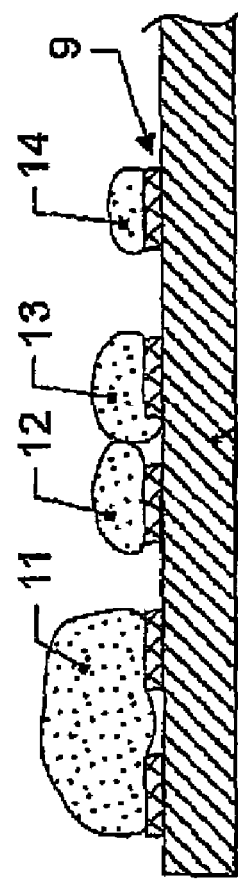
FIG. 2 is a sectional view of a defectively formed substrate 10 comprising irregular contact structures corresponding to contact bumps 11, 12, 13, 14, which have neither regular, nor ball shape.

FIGS. 1 and 2 illustrate in a direct comparison a substrate 10, which may be a wafer or a printed board. The illustration according to FIG. 1 shows that the contact places 25, usually called contact bumps, which are made of a meltable solder material melting at a melting temperature of 183° C., are adapted to have a regular or uniform shape. They are arranged on a UBM metallization (under bump metallization) which is a segmented intermediate metallization 9 made of nickel with for example a gold cover, for obtaining a diffusion barrier with respect to the actual bond pads on the substrate 10, said bond pads usually being made of aluminium. The proportions are not illustrated to correct scale, the illustrations being only schematic, for showing the method and for providing an enlarged view of asymmetries in the contact geometries as shown in FIG. 2.

FIG. 1 shows that a surface of the substrate 10 is designated as 10a. The thickness of the substrate is s. For wafers, said thickness is in a range of above 500 µm, whereas the height of the intermediate nickel supports 9, which are provided as UBM, is in a range of between 5 µm and 10 µm. Said metallic support segments have a substantially smaller surface than the surface 10a of the substrate 10. The distance to be provided between two such limited support segments 9 corresponds to at least the double height of regularly applied contact structures 25 according to FIG. 1.

The defects according to FIG. 2 can be explained as follows: Between the left two intermediate metallizations, an enlarged contact bump 11 is visible which has been formed as an excessively raised contact bump by two neighbouring contact bumps melting together. Such an inner shortcut between two contact bumps to be insulated sometimes occurs during the production of contact bumps, when too large quantities of a solder are applied, for example by screen-printing, or when a too large layer thickness of a flow medium is applied which is required for a reflow (a reflow process) in an oven, to reshape smaller grain structures of an applied preliminary contact bump to a ball-shaped contact bump with a smooth surface. A similar contact between two contact bumps 12 and 13 is illustrated at the following two contact segments 9, the height of the contact bumps, however, being smaller. Only a displacement and a bridging take place. A contact bump 14 of a slightly too small height is arranged on the following intermediate metallization 9. A non-illustrated variant of a defect is the absence of a contact bump on an intermediate support 9, which in this case is empty. A variant, which is also not shown, is an unintentional application of a wrong solder as a metallic bump on the complete surface of the substrate 10, which would be undesirable even if a ball-shaped structure 25 according to FIG. 1 would have been obtained for all contact bumps of said substrate 10.

When the substrate 10 is a wafer, its value is higher than the value which has to be expended for an inexpensive method of repairing said wafer with respect to its contact structures, thus removing the defective contact bumps and replacing them by regular contact bumps 25.

The remaining figures show how such unification on the surface of a substrate 10 can be achieved. In this respect, reference is first made to FIG. 4. In FIG. 4, a substrate 10 is provided with asymmetric contact bumps 17, 18 as shown. A still tolerable contact bump beside said contact bump 17 could in fact be left unchanged, but the embodiment of the method is based on completely melting off all contact bumps, when lowering said substrate down in a vertical direction v2, a tub 28 containing a metallic bath 32 being provided below the substrate 10, a surface 32a of said bath being oriented towards the contact bumps 17, 18 to be melted off.

The described relative movement v2 can also be performed such that the substrate is stationary or immobile and the tub 28 is moved towards the substrate. In a relative lowering movement, the substrate 10 is lowered with respect to the surface 32a so far that at least the laterally limited support segments 9 contact said surface 32a and the complete area of defectively applied contact bumps, which area extends over said support segments in a downward direction, and the area of correctly applied contact bumps—in the figure, only the defective contact bumps are illustrated with otherwise regular contact bumps according to FIG. 1—is removed completely and taken up by said bath 32.

The period of time during which said substrate 10 remains approached to said surface 32a should be dimensioned such that sufficient time remains for melting off the contact bumps 18, 17 and for heating the support segments 9 to have continuously throughout their surface at least the melting temperature of the solder of the contact bumps. In this case, a uniform melting off of the contact bumps is achieved and, after removal in a direction v2' and turning over of said substrate 10, a structure according to FIG. 3 is obtained.

Figure 3:
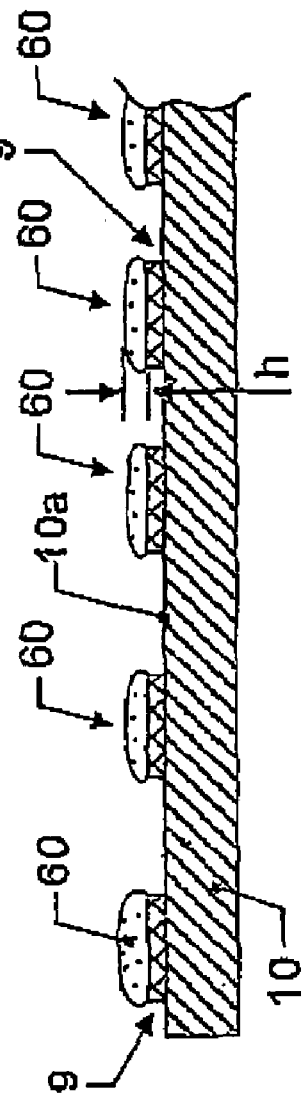
FIG. 3 is a sectional view of a substrate comprising metallic support segments 9 according to FIGS. 1,2 and dome-shaped menisci 60 provided on said segments, such menisci being formed after a melting-off process or after a first coating of still uncoated support segments 9.

In FIG. 3, a known structure is illustrated in which each individual intermediate support 9 carries a dome-shaped meniscus 60 which forms a vault at an acute angle starting from the edge of the respective laterally limited support 9, said vault being caused by the surface tension of the solder remaining on the support. The height of the domes 60 is designated as h, said height being substantially smaller than the regular height of the contact structures 25 of FIG. 1, but substantially in a range of the height of the intermediate metallization 9, which is also known in the prior art as a UBM metallization. The substrate 10 and also the metallic intermediate supports 9 are not modified in structure, their melting temperature being above the temperature of the metallic bath 32 of molten metal.

It is to be understood that the molten metal will usually be an alloy which is suitable to a "soldering" of nickel and which, with regard to its resistance, is suitable for contact structures. Tin or alloys of tin are used, as well as silver alloys or indium alloys.

The bath 32 can have the same material property as the contact bumps to be melted off. When the contact bumps have unintentionally been prepared from a false material, said bath 32 serves not only for melting off the contact bumps, but also for exchanging the menisci 60 according to FIG. 3, which, after having been treated according to FIG. 4, have the material property determined by said bath 32.

The difference between the volume quantity of a meniscus 60 and the volume quantity of a contact bump either regularly or defectively applied according to FIG. 1 or FIG. 2 is the quantity which is removed when the molten metal 32 has a material property identical with that of the contact bumps. When said molten metal has a different material property, the total volume of the contact bumps 25 of FIG. 1 is removed by melting.

A further embodiment of providing an alternative molten metal is illustrated in FIG. 5. Said figure shows a flow bath 31 which is in a continuous movement along a portion which in a top plan view has a band shape, to which movement a metallic bath 30 provided inside a receptacle 29 is subjected. The wave crest raised with respect to the remaining surface of the metallic bath serves as a melting-off portion for a substrate 10 which is moved in a horizontal direction above said wave crest, said substrate, according to FIG. 6, being moved towards said wave 31 along a movement v1. An auxiliary layer 40 on said wave 31 will be explained later and shall at present not be considered for the description of the melting-off process.

Said movement v1 is so slow that the width of the wave is sufficient for obtaining a uniform melting off of the defective contact bumps 11, 12 and for achieving a surface which is identical to the surface shown in FIG. 3 as a result of the method of FIG. 4, after moving said substrate 10 over.

In contrast to FIG. 4, when using the method according to FIGS. 5 and 6, the total number of contact bumps is removed successively, independent of having been formed defectively or regularly. In the embodiment of FIG. 4, all contact bumps were melted off practically simultaneously by contacting the surface 32, the only difference in time being due to a different height of the contact bumps, which results in a slightly later time of contact with said surface 32a. Accordingly, this is designated as simultaneous, whereas a horizontal movement provides a band-shaped melting off of the contact bumps along a surface 10a of said substrate 10, maintaining the meniscus-like domes 60 on the support segments 9 of said substrate 10.

FIG. 6a illustrates an advantageous supplementation of said substrate 10 according to FIG. 6. According to FIG. 6a, an additional fluid layer 41 is provided as a film to cover the contact structures 11, 12, 13, the support segments 9 and the surface 10a of the substrate. The thickness of said film 41 as a thin layer is designated as d. Said thickness substantially corresponds to the height of the contact bumps 11, but said layer 41 can be adapted to fill up only the portions between the contact bumps.

The consistency of said fluid layer 41 corresponds to that of the fluid layer 40 of FIG. 5 which is provided alternatively or cumulatively. It consists of a polyalcohol, particularly glycerol, which has a boiling point of 290° C. and is above a first temperature limit which is required for melting off the contact bumps from the support segments 9.

As the provided layer is thin, only a small volume of such a fluid is required as an auxiliary processing substance. Above all, when using a temperature in the range of the melting temperature of the solder and a thin film, an evaporation of said film after contacting the molten metal 31 is obtained. Due to said evaporation, an additional cleaning step is not required. The surface profile and also the surface structure shown in FIG. 3 already form a surface suitable for being again provided with metallic bumps, without a cleaning step having to first remove the auxiliary processing substance. Said auxiliary substance also has a favourable effect on the detachment, resulting in the pinching during melting off and also unifying or homogenizing the formation of menisci according to FIG. 3. Alternative substances of glycerol are paraffin wax or other substances mentioned in the prior art, as cited above.

Said substrate 10 with said film-like covering layer according to FIG. 6a can also be used in connection with FIG. 4.

Figure 7:
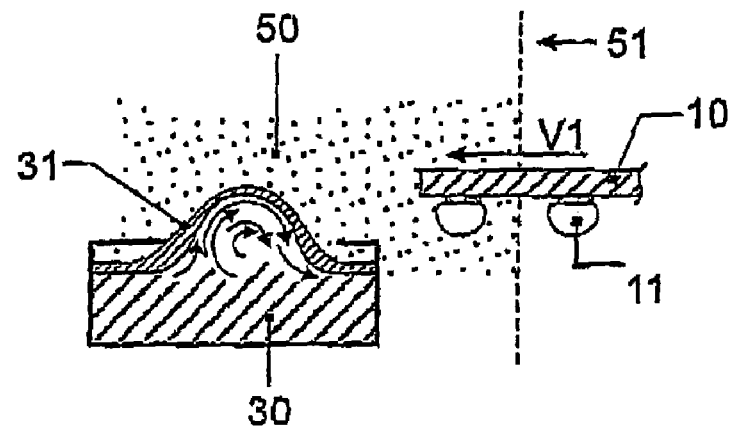
FIG. 7 is an alternative illustration with respect to FIG. 5, showing the movement of a substrate towards a flow bath as a molten metal 30 kept in motion, an atmosphere 50 being provided as from a vertical level 51, said atmosphere favouring a uniform melting-off.

The formation of the film shall now be described according to FIGS. 7 and 8: Said figures schematically illustrate a substrate 10 entering an atmosphere 50 as from a vertical is barrier level 51, said atmosphere causing a film to be formed on a side 10a of said substrate 10 on which side raised contact bumps 11, 25 (as examples of the contact bumps of FIGS. 1, 2) are schematically illustrated. In fact, the atmosphere also cares for the back side of the substrate to be covered with such a film layer which, however, is not critical for a melting off in a flow bath 31 with a molten metal 30 provided according to FIG. 5.

Said barrier 51 can be shifted to the left or to the right. The substrate with its surface 10a is coated on the side of the contact structures either prior to or simultaneously with contacting the molten metal 31. Despite a small volume of the described fluid, a uniform covering of the illustrated structures is obtained by using a gaseous phase 50.

Figure 8:
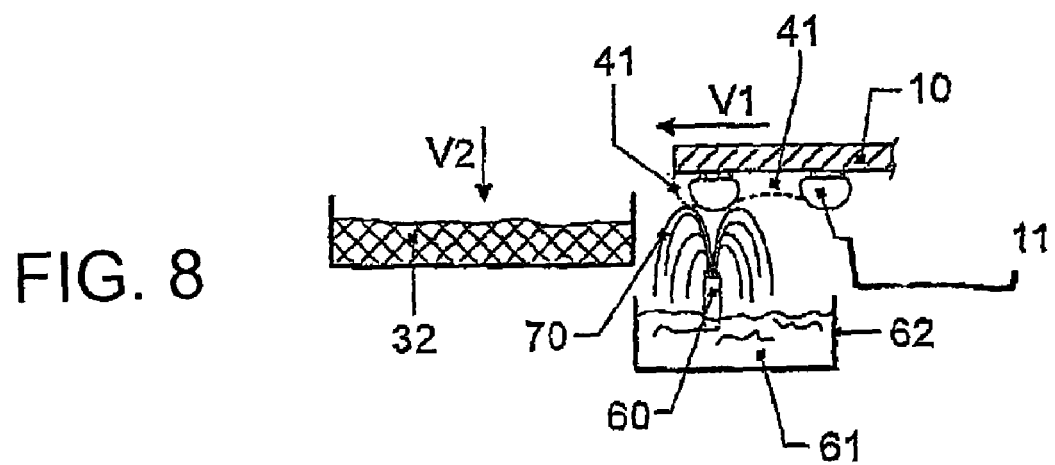
FIG. 8 represents an alternative method with respect to FIG. 4, wherein a film-like coating of an organic fluid is sprayed onto the raised contact places and onto the substrate prior to lowering said substrate down into an immobile or stationary bath 32 by a combination of a horizontal movement v1 and a vertical movement v2.

FIG. 8 shows an alternative coating method, by spray-coating the contact structures 25, 11 on said substrate 1. By providing a fountain 70 from an ascent pipe 60 and a fluid swamp 61 in a tub 62, a formation of the film-like coating 41 of the surface of the contact structures is obtained. According to this embodiment, said contact structures are introduced into a metallic bath according to FIG. 4 by a combined horizontal and vertical movement v1, v2, all contact bumps being melted off simultaneously. Said thin layer 41 is also melted off in the sense of an evaporation. The variants of FIGS. 7 and 8 as well as of FIGS. 6 and 4 can be supplemented and extended by introducing uncoated support segments 9 for the first time into the metallic flow bath 31 or the metallic bath 32 with a surface 32a. In this respect, the film-like coating according to FIG. 6a at a reduced thickness d can illustrate that only a very small quantity of the fluid is required for obtaining a first coating of the metallic support segments 9. The resulting structure also corresponds to that of FIG. 3, by forming dome-shaped menisci 60 on the free surfaces of the metallic support segments 9. The film-like layer 41 evaporates as described before, so that no additional cleaning step is required.

When using a substrate not yet provided with contact bumps, the flow bath of FIG. 5, by a film-like covering 40 of at least the wave portion 31 provide a uniform first coating by first menisci 60 on the metallic support segments 9 and cause the remaining layers formed on the surface 10a of the substrate to evaporate.

Consequently, the method is equally suitable for both a melting off of under bump metallizations already provided with raised contact structures and a first coating of said under bump metallizations 9, which are usually made of nickel on an aluminium bond pad.

The invention claimed is:

1. A method for removing a plurality of raised places of contact as bumps, said bumps providing surface contact zones above a substrate, suitable for flip chip contacting to other surfaces, wherein at least some of said raised places of contact are one of non-uniform and irregular, thereby unsuited for flip chip contacting to other surfaces, wherein metallic support segments of a limited lateral size are provided between said raised places of contact and said substrate, said support segments having a melting temperature above a first temperature limit, the raised places of contact made of meltable metal, said meltable metal being meltable above the first temperature limit, said raised places of contact being surface-distributed over the substrate and said substrate not melting within a region of the first temperature limit, wherein a plurality of said raised places of contact are at least in substantial portions melted off from said substrate by contacting the raised contact places for providing surface contact, with one of a molten metal and a molten metallic alloy, wherein the substrate carries a layer of organic fluid for covering or surrounding said raised places of contact prior to contacting them with said molten metal or molten metallic alloy, and the support segments are kept present on said substrate after melting off said at least substantial parts of said raised places of contact, wherein after melting off said bumps as raised places of contact, dome shaped portions of molten metal remain on said support segments on the substrate, said dome shaped molten metal portions cooled down to solidify and form vaulted domes for one of unifying and homogenizing surfaces of said support segments and consisting substantially of metallic material used for melting off.

2. The method of claim 1, wherein said one of the molten metal and the molten metallic alloy used for melting off is substantially the same as the meltable metal of said raised places of contact.

3. The method of claim 2, wherein the meltable metal of said raised places of contact comprises a solder including at least one of tin, silver and lead.

4. The method of claim 1, wherein molten metal is used for melting off and is substantially the same as the meltable metal of the raised contact places to be melted off.

5. The method of claim 1, wherein said raised places of contact contain a first material, said first material being replaced by one of the molten metal and the molten metallic alloy, used for said melting.

6. The method of claim 1, wherein the melting off is performed by an at least contact immersion into a metal bath and by approaching a number of said raised places of contact and said bath towards each other by a relative movement for contacting said molten metal with said number of places of contact, and wherein the number of raised places of contact to be removed are melted off substantially simultaneously.

7. The method of claim 6, wherein said relative movement extends at least to a contact of a surface of the bath with laterally limited support segments between the raised contact places and said substrate, up to a contact of the surface of the bath with a surface of the substrate facing said bath.

8. The method of claim 7, followed by a residence time, said residence time being followed by a relative movement in an opposite direction, by which movement said bath and said substrate being separated from each other.

9. The method of claim 1, wherein said one of the molten metal and metallic alloy comprises a metal bath kept in motion in at least a band portion thereof.

10. The method of claim 9, wherein the raised places of contact are moved substantially in parallel to a surface of the metal bath and relatively thereto, and said raised places of contact, surface-distributed over the substrate, are melted off successively.

11. The method of claim 1, wherein the raised places of contact are moved, and a speed of the movement is selected to allow each support segment on the substrate a minimum residence time in at least one of a bath and a band portion of molten metal kept in motion, said minimum residence time being sufficient to cause a respectively associated raised place of contact to be melted off.

12. The method of claim 1, wherein said organic fluid has a boiling point above said first temperature limit.

13. The method of claim 1, wherein said organic fluid layer is applied onto a surface of the substrate by one of sputtering and evaporation, where the bumps as raised places of contact to be removed are located.

14. The method of claim 1, wherein the organic fluid layer has a maximum thickness of twice a height of said bumps as raised places of contact.

15. The method of claim 14, wherein the thickness of the fluid layer is smaller than a thickness of the substrate.

16. The method of claim 14, wherein the thickness of the fluid layer corresponds substantially to the height of said raised places of contact.

17. The method of claim 1 wherein after melting off said bumps as raised places of contact, said layer of organic fluid has substantially evaporated.

18. The method of claim 1, wherein said layer of organic fluid is thin relative to a thickness of the substrate.

19. The method of claim 1, wherein the layer of a not yet evaporated organic fluid is present on a surface of a metal bath that is kept in motion, and wherein said organic fluid on the surface of the metal bath provides said organic fluid layer on the substrate.

20. The method of claim 1, wherein said dome shapes have a height that is substantially smaller than a height of said raised places of contact.

21. The method of claim 1, wherein said meltable metal contacted at said places of contact is selected from the group consisting of tin, indium, and an alloy containing at least tin or indium.

22. A method for forming raised, vaulted domes as raised places of contact on a plurality of metallic carrying segments distributed over a surface of a substrate, said substrate having a thickness, and a molten metal being heated to a first temperature and said carrying segments provided on said substrate being contacted with said heated molten metal for forming said vaulted domes, wherein an organic fluid layer is present between said substrate and said carrying segments, distributed over said substrate, and a surface of said molten metal, said organic fluid being present as a cover layer only and evaporating from the surface of said substrate substantially without residues after said raised, vaulted domes have been formed, and wherein said substrate has the raised places of contact on the metallic carrying segments prior to contacting the molten metal, and new domes are formed by melting off said raised places of contact by said molten metal, said new domes having a substantially smaller height than said raised places of contact prior to melting off.

23. The method of claim 22, wherein said fluid layer is applied onto said substrate through an evaporated condition for formation of said vaulted domes on said carrying segments.

24. The method of claim 22, wherein said cover layer is applied by sputtering onto the surface of said substrate prior to contacting the molten metal.

25. The method of claim 22, wherein prior to contacting said molten metal, said carrying segments are covered with no more than an organic fluid film, whereby a smooth surface and uniform domes are obtained upon contacting the molten metal.

26. The method of claim 22, wherein said cover layer is present on the surface of the substrate as a film, and a surface of the film which faces away from the substrate is subject to a surrounding atmosphere.

* * * * *